US012772798B2

(12) United States Patent
Yasui et al.

(10) Patent No.: US 12,772,798 B2
(45) Date of Patent: Oct. 20, 2026

(54) SUSCEPTOR

(71) Applicant: NGK INSULATORS, LTD., Nagoya City (JP)

(72) Inventors: Keiichi Yasui, Handa City (JP); Reon Takanoya, Handa City (JP)

(73) Assignee: NGK INSULATORS, LTD., Nagoya (JP)

(*) Notice: Subject to any disclaimer, the term of this patent is extended or adjusted under 35 U.S.C. 154(b) by 380 days.

(21) Appl. No.: 18/520,716

(22) Filed: Nov. 28, 2023

(65) Prior Publication Data

US 2024/0266208 A1 Aug. 8, 2024

Related U.S. Application Data

(63) Continuation of application No. PCT/JP2023/003830, filed on Feb. 6, 2023.

(51) Int. Cl.
*H10P 72/76* (2026.01)
*H10P 72/00* (2026.01)

(52) U.S. Cl.
CPC ...... *H10P 72/7626* (2026.01); *H10P 72/0402* (2026.01); *H10P 72/7616* (2026.01)

(58) Field of Classification Search
CPC .......................... H10P 72/722; H10P 72/7624
USPC ............................................ 118/728, 723 E
See application file for complete search history.

(56) References Cited

U.S. PATENT DOCUMENTS 5,968,379 A * 10/1999 Zhao .................. C23C 16/4586 219/121.52
6,120,608 A * 9/2000 Shendon ............ H10P 72/7624 118/724
6,494,955 B1 12/2002 Lei et al.
6,645,303 B2 * 11/2003 Frankel ................ G07C 15/006 156/345.52
7,567,421 B2 * 7/2009 Miyashita .............. H10P 72/70 156/345.23

(Continued)

FOREIGN PATENT DOCUMENTS

JP 2005-268654 A 9/2005
JP 5301065 B2 9/2013

(Continued)

OTHER PUBLICATIONS

English translation of the International Search Report dated Apr. 4, 2023 (Application No. PCT/JP2023/003830).

(Continued)

*Primary Examiner* — Jason L Vaughan
(74) *Attorney, Agent, or Firm* — Muncy, Geissler, Olds & Lowe, P.C.

(57) ABSTRACT

There is provided a susceptor for a film deposition apparatus or for an etching apparatus, including a ceramic plate including a first surface on which a wafer is to be placed, and a second surface opposed to the first surface, and embedded with an internal electrode; a cylindrical ceramic shaft attached to the second surface of the ceramic plate; a gas supply hole penetrating through the ceramic plate and the ceramic shaft to extend from the first surface of the ceramic plate to a distal end of the ceramic shaft away from the ceramic plate through the second surface; and a porous plug embedded in a portion of the gas supply hole corresponding to at least the ceramic plate.

10 Claims, 3 Drawing Sheets

(56) References Cited

U.S. PATENT DOCUMENTS

| | | | | |
|---|---|---|---|---|
| 9,660,557 | B2 | 5/2017 | Shiraiwa et al. | |
| 10,770,270 | B2 * | 9/2020 | Cho | H01J 37/32724 |
| 11,276,602 | B2 * | 3/2022 | Shiraishi | H01J 37/32724 |
| 11,367,597 | B2 * | 6/2022 | Lee | H01J 37/3244 |
| 11,515,192 | B2 | 11/2022 | Furukawa | |
| 11,626,310 | B2 | 4/2023 | Shiraishi et al. | |
| 11,688,590 | B2 | 6/2023 | Unno et al. | |
| 11,735,458 | B2 * | 8/2023 | Minemura | C04B 35/10 279/128 |
| 12,198,964 | B2 * | 1/2025 | Shiraishi | H01J 37/3244 |
| 12,272,590 | B2 * | 4/2025 | Taguchi | C23C 16/45551 |
| 12,341,048 | B2 * | 6/2025 | Sulyman | H01J 37/32449 |
| 12,473,649 | B2 * | 11/2025 | Takebayashi | C23C 16/4586 |
| 2020/0135529 | A1 * | 4/2020 | Shiraishi | H10P 72/72 |
| 2020/0312696 | A1 | 10/2020 | Unno et al. | |
| 2021/0082731 | A1 | 3/2021 | Miyazawa | |
| 2023/0207370 | A1 * | 6/2023 | Inoue | H10P 72/722 257/703 |
| 2024/0297062 | A1 * | 9/2024 | Inoue | H10P 72/722 |

FOREIGN PATENT DOCUMENTS

| | | | |
|---|---|---|---|
| JP | 2020-072262 | A | 5/2020 |
| JP | 2021-048243 | A | 3/2021 |
| KR | 10-2013-0129842 | A | 11/2013 |
| KR | 10-2020-0047675 | A | 5/2020 |
| KR | 10-2020-0133657 | A | 11/2020 |
| WO | 2019/187785 | A1 | 10/2019 |

OTHER PUBLICATIONS

Korean Office Action (with English translation) dated Oct. 29, 2024 (Application No. 10-2023-7041144).

International Search Report and Written Opinion dated Apr. 4, 2023 (Application No. PCT/JP2023/003830).

English translation of the Written Opinion of the International Searching Authority dated Apr. 4, 2023 (Application No. PCT/JP2023/003830).

* cited by examiner

SUSCEPTOR

CROSS-REFERENCE TO RELATED APPLICATION

This application is a continuation application of PCT/JP2023/003830 filed Feb. 6, 2023, the entire contents which are incorporated herein by reference.

BACKGROUND OF THE INVENTION

1. Field of the Invention

The present invention relates to a susceptor for a film deposition apparatus or for an etching apparatus.

2. Description of the Related Art

A film deposition apparatus and an etching apparatus for a semiconductor manufacturing process use a susceptor for supporting a wafer. As such a susceptor, a susceptor including a ceramic plate on which the wafer is to be placed, and a cylindrical ceramic shaft attached to the ceramic plate is widely used.

The susceptor including the ceramic shaft and gas supply holes for supplying gas to a surface of the ceramic plate is known. For example, Patent Literature 1 (WO2019/187785) discloses an electrostatic chuck heater that includes a disc-shaped ceramic base including an electrostatic electrode and a heating resistor, a hollow shaft, a protruding ring, and through holes. In the electrostatic chuck heater, the through holes are provided so as to extend from a lower end of a peripheral wall of the hollow shaft to a predetermined position on a surface of the ceramic base, which makes it possible to supply gas from the lower end of the hollow shaft to a below-wafer space surrounded by the ceramic base, the protruding ring, and the wafer. When the gas is supplied to the below-wafer space, a component becoming a conductive film hardly flows into a gap between the protruding ring and the wafer, and an undesirable conductive film hardly adheres to an upper surface of the protruding ring.

In the electrostatic chuck, a method in which a porous portion is provided to prevent arc discharge in a gas introduction path is known. For example, Patent Literature 2 (JP2020-072262A) discloses an electrostatic chuck including a ceramic dielectric substrate, a base plate supporting the ceramic dielectric substrate and including gas introduction paths, and porous portions provided at positions facing the gas introduction paths, between the base plate and the ceramic dielectric substrate.

CITATION LIST

Patent Literature

Patent Literature 1: WO2019/187785
Patent Literature 2: JP2020-072262A

SUMMARY OF THE INVENTION

In an existing susceptor including the gas supply holes as disclosed in Patent Literature 1, as illustrated in FIG. 5, gas supply holes 116 are configured as through holes extending from a distal end 114*a* (end assembled to apparatus) of a ceramic shaft 114 to a surface 112*a* of a ceramic plate 112. Under a high-output plasma environment, however, an insulation distance from the surface 112*a* of the ceramic plate to the distal end 114*a* of the ceramic shaft 114 may be insufficient, and arcing may accordingly occur. More specifically, the distal end 114*a* of the ceramic shaft 114 is assembled to a metal part 122 constituting an apparatus, and accordingly abnormal discharge may occur due to the insufficient insulation distance between the metal part 122 and the surface 112*a* of the ceramic plate exposed to plasma.

The inventors found that, in a susceptor including a gas supply hole penetrating through a shaft and a plate, embedding a porous plug at a predetermined position of the gas supply hole makes it possible to suppress occurrence of arcing under a high-output plasma environment.

An object of the present invention is to provide a susceptor that can suppress occurrence of arcing under a high-output plasma environment while including a gas supply hole penetrating through a shaft and a plate.

The present invention provides the following aspects.

[Aspect 1] A susceptor for a film deposition apparatus or for an etching apparatus, the susceptor comprising:
- a ceramic plate including a first surface on which a wafer is to be placed, and a second surface opposed to the first surface, and embedded with an internal electrode;
- a cylindrical ceramic shaft attached to the second surface of the ceramic plate;
- a gas supply hole penetrating through the ceramic plate and the ceramic shaft, the gas supply hole starting from the first surface of the ceramic plate, passing through the second surface, and extending to a distal end of the ceramic shaft away from the ceramic plate; and
- a porous plug embedded in a portion of the gas supply hole corresponding to at least the ceramic plate.

[Aspect 2] The susceptor according to aspect 1, further comprising a cooling jacket fixed to the distal end of the ceramic shaft, the cooling jacket including a through hole communicating with the gas supply hole.

[Aspect 3] The susceptor according to aspect 1 or 2, further comprising a protective pipe made of ceramic and forming an inner wall of the gas supply hole in a region between a lower end of the porous plug and the distal end of the ceramic shaft.

[Aspect 4] The susceptor according to aspect 3, wherein the protective pipe is made of alumina.

[Aspect 5] The susceptor according to any one of aspects 1 to 4, wherein the gas supply hole includes, in the ceramic plate, a small-diameter portion having a diameter less than a diameter of the porous plug, the small-diameter portion and a lower portion other than the small-diameter portion of the gas supply hole form a step, and an upper end of the porous plug is regulated by the step not to move above the step.

[Aspect 6] The susceptor according to any one of aspects 1 to 5, further comprising an elastic member having gas permeability and provided at the distal end in the gas supply hole.

[Aspect 7] The susceptor according to any one of aspects 2 to 6, further comprising: an elastic member having gas permeability and provided at the distal end in the gas supply hole; and a protective pipe made of ceramic and forming an inner wall of the gas supply hole in a region between a lower end of the porous plug and the distal end of the ceramic shaft, wherein the elastic member is interposed between the cooling jacket and the protective pipe.

[Aspect 8] The susceptor according to any one of aspects 1 to 7, wherein the porous plug is further embedded in a portion of the gas supply hole corresponding to the ceramic shaft.

[Aspect 9] The susceptor according to any one of aspects 2 to 8, further comprising an elastic member having gas permeability and provided at the distal end in the gas supply hole, wherein the porous plug is further embedded in a portion of the gas supply hole corresponding to the ceramic shaft, and the elastic member is interposed between the cooling jacket and the porous plug.

[Aspect 10] The susceptor according to any one of aspects 6 to 9, wherein the elastic member is a spring.

[Aspect 11] The susceptor according to any one of aspects 2 to 10, further comprising a clamp ring configured to engage with the distal end of the ceramic shaft, and to fix the ceramic shaft to the cooling jacket.

DETAILED DESCRIPTION OF THE INVENTION

A susceptor according to the present invention is a table for supporting a wafer, used for a film deposition apparatus or an etching apparatus, in particular, used for a film deposition apparatus or an etching apparatus for a semiconductor manufacturing process. For example, the susceptor according to the present invention may be a ceramic heater for a semiconductor film deposition apparatus or an electrostatic chuck for a semiconductor etching apparatus. Alternatively, the susceptor according to the present invention may be an electrostatic chuck heater having a heater function and an electrostatic chuck function. Typical examples of the film deposition apparatus include a CVD (chemical vapor deposition) apparatus (for example, thermal CVD apparatus, plasma CVD apparatus, optical CVD apparatus, and MOCVD apparatus) and a PVD (physical vapor deposition) apparatus.

Figure 1:
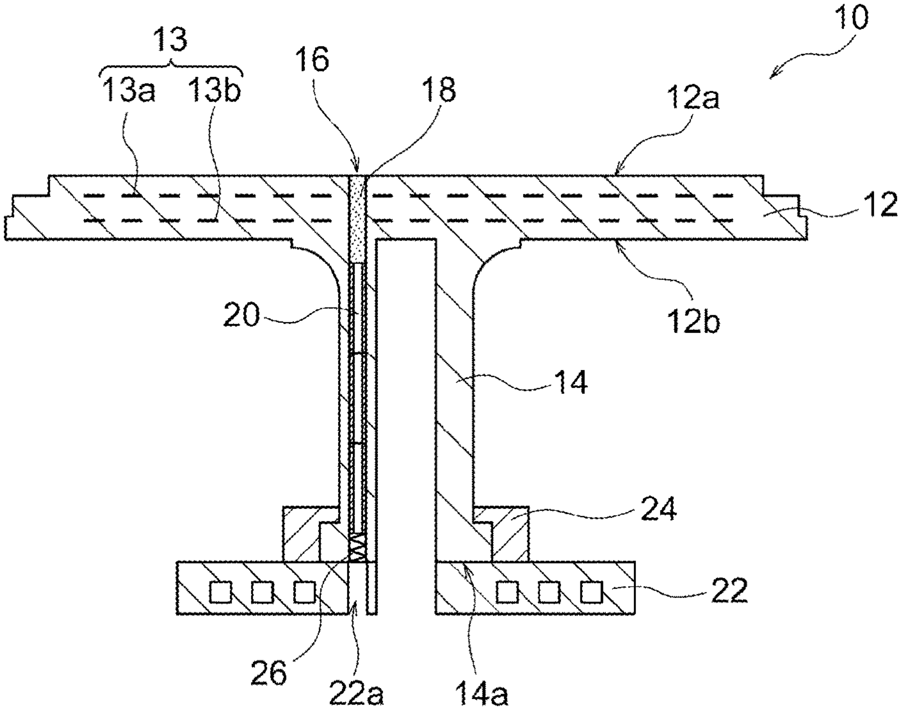
FIG. 1 is a schematic cross-sectional view illustrating an example of a susceptor according to the present invention.
Figure 2:
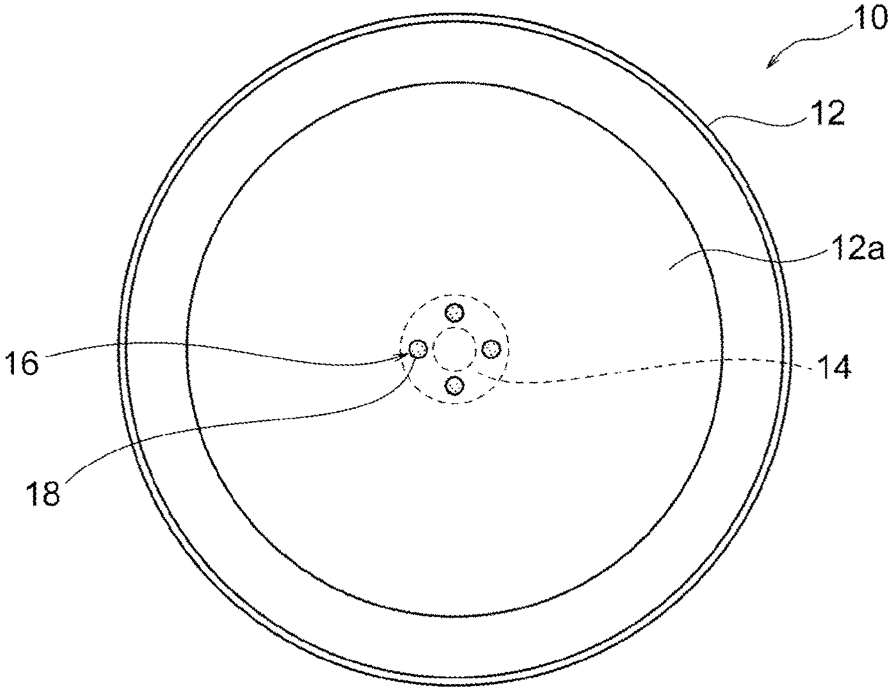
FIG. 2 is a schematic top view of the susceptor illustrated in FIG. 1.

FIGS. 1 and 2 each illustrate an example of the susceptor. A susceptor 10 illustrated in FIGS. 1 and 2 includes a ceramic plate 12, a cylindrical ceramic shaft 14, gas supply holes 16, and porous plugs 18. An internal electrode 13 is embedded in the ceramic plate 12. The ceramic plate 12 includes a first surface 12*a* on which a wafer (not illustrated) is to be placed, and a second surface 12*b* opposed to the first surface 12*a*. The ceramic shaft 14 is attached to the second surface 12*b*. Each of the gas supply holes 16 is configured to penetrate through the ceramic plate 12 and the ceramic shaft 14 such that the gas supply holes 16 start from the first surface 12*a* of the ceramic plate 12, pass through the second surface 12*b*, and extend to a distal end 14*a* of the ceramic shaft 14 away from the ceramic plate 12. The porous plugs 18 are embedded in portions of the gas supply holes 16 corresponding to at least the ceramic plate 12. As described above, in the susceptor 10 including the gas supply holes 16 penetrating through the ceramic shaft 14 and the ceramic plate 12, embedding the porous plugs 18 at predetermined positions of the gas supply holes 16 makes it possible to suppress occurrence of arcing under a high-output plasma environment.

Figure 5:
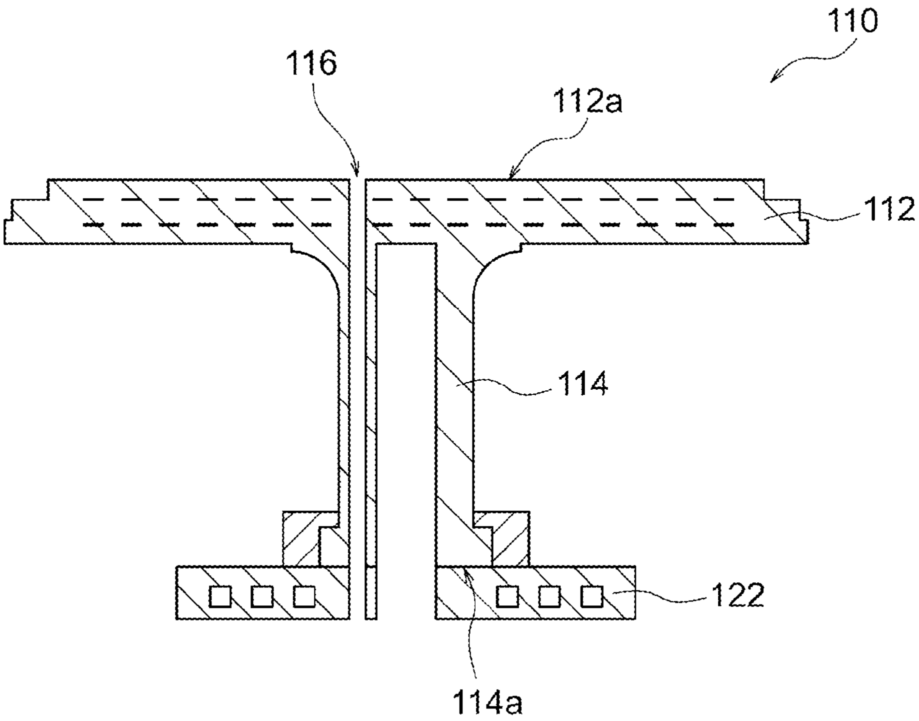
FIG. 5 is a schematic cross-sectional view illustrating an example of an existing susceptor.

As described above, in an existing susceptor 110 including the gas supply holes 116 as through holes as illustrated in FIG. 5, the insulation distance from the surface 112*a* of the ceramic plate to the distal end 114*a* of the ceramic shaft 114 may be insufficient, and arcing may accordingly occur under the high-output plasma environment. More specifically, the distal end 114*a* of the ceramic shaft 114 is assembled to the metal part 122 constituting the apparatus, and accordingly abnormal discharge may occur due to the insufficient insulation distance between the metal part 122 and the surface 112*a* of the ceramic plate exposed to plasma. In contrast, according to the present invention, the porous plugs 18 are embedded in the portions of the gas supply holes 16 corresponding to at least the ceramic plate 12, which makes it possible to suppress occurrence of arcing. This is because the porous plugs 18 close the gas supply holes 16 so as to allow gas to pass therethrough, which makes it possible to extremely lengthen lengths of gas passages. In other words, the porous plugs 18 each have an open-porous structure because the porous plugs 18 have ventilatable porous properties. The lengths of the gas passages provided by the open-porous structures are far longer than lengths of the gas supply holes 16 as a matter of course. In addition, the porous plugs 18 are generally made of an insulation material such as ceramic, and are accordingly excellent in insulation resistance and are also excellent in arcing suppression effect. Thus, it is possible to prevent arcing (abnormal discharge) that may occur due to the insufficient insulation distance between the distal end 14*a* of the ceramic shaft 14 and the first surface 12*a* of the ceramic plate 12. In that sense, it is unnecessary to change lengths of the ceramic shaft 14 and the gas supply holes 16 from lengths of existing ones, and the susceptor is advantageously usable in an existing film deposition apparatus and an existing etching apparatus without changing design.

The ceramic plate 12 can include a configuration similar to a configuration of a ceramic plate adopted in a well-known ceramic susceptor. A main portion (namely, ceramic base) of the ceramic plate 12 other than the internal electrode 13 is preferably made of aluminum nitride in terms of excellent heat conductivity, high electric insulation property, thermal expansion characteristics close to silicon, and the like.

A preferable shape of the ceramic plate 12 is a disc shape. However, it is unnecessary for the disc-shaped ceramic plate 12 to have a perfect circular shape in a planar view, and the shape of the ceramic plate 12 may be a partially-lacked imperfect circular shape such as an orientation flat in a planar view. A size of the ceramic plate 12 is appropriately determined based on a diameter of a wafer assumed to be used, and is not particularly limited. In a case of a circular shape, a diameter of the ceramic plate 12 is typically 150 mm to 450 mm, and for example, about 300 mm.

Protrusions (not illustrated) are preferably provided on the first surface 12*a* of the ceramic plate 12. The protrusions come into contact with a bottom surface of the wafer to support the wafer, and secure a flow path of gas (for example, heat-transfer gas) supplied from the gas supply holes 16. The protrusions are preferably arranged at equal intervals on the first surface 12*a* of the ceramic plate 12. A shape of each of the protrusions is not particularly limited, but is preferably a columnar shape. A diameter of each of the protrusions is not particularly limited, but is preferably 0.1 mm to 8 mm, more preferably 0.5 mm to 5 mm, still more preferably 0.5 mm to 4 mm, and especially preferably 0.70 mm to 2.54 mm. The protrusions are preferably formed integrally with the ceramic plate 12 by embossing or the like. Accordingly, the protrusions are preferably made of aluminum nitride as with the ceramic plate 12. A height of each of the protrusions is not particularly limited, but is preferably 0.001 mm to 0.1 mm, more preferably 0.005 mm to 0.08 mm, still more preferably 0.01 mm to 0.05 mm, and especially preferably 0.01 mm to 0.03 mm. A distance between center axes of adjacent protrusions is preferably 4 mm to 30 mm, more preferably 5 mm to 26 mm, still more preferably 7 mm to 26 mm, and especially preferably 7 mm to 15 mm.

The internal electrode 13 is embedded in the ceramic plate 12. Preferable examples of the internal electrode 13 include an ESC electrode, a heater electrode, and an RF electrode. For example, as in an illustrated example, two types of internal electrodes 13*a* and 13*b* may be provided.

The internal electrode 13*a* provided in a region close to the first surface 12*a* may be the ESC electrode. The ESC electrode is an abbreviation of an electrostatic chuck (ESC) electrode, and is also referred to as an electrostatic electrode. The ESC electrode is preferably a circular thin-layer electrode having a diameter slightly smaller than the diameter of the ceramic plate 12, and may be, for example, a mesh-sheet electrode obtained by weaving thin metal wires in a net shape. The ESC electrode may be used as a plasma electrode. More specifically, when a high frequency wave is applied to the ESC electrode, the ESC electrode can be used as the plasma electrode, and film deposition by a plasma CVD process can be performed. An ESC rod (not illustrated) for power supply is connected to the ESC electrode, and the ESC rod is connected to an external power supply (not illustrated) through an internal space of the ceramic shaft 14. When a voltage is applied from the external power supply, the ESC electrode chucks the wafer placed on the first surface 12*a*. Chucking force at this time is Johnson-Rahbeck force because a volume resistivity of aluminum nitride that may constitute the main portion of the ceramic plate 12 is $1\times10^{8}$ Ωcm to $1\times10^{13}$ Ωcm.

The internal electrode 13*b* provided in a region close to the second surface 12*b* may be the heater electrode. The heater electrode is not particularly limited, but may be, for example, an electrode obtained by laying a conductive coil as a single continuous line over an entire surface of the ceramic plate 12. Heater rods (not illustrated) for power supply are connected to both ends of the heater electrode, and the heater rods are connected to a heater power supply (not illustrated) through the internal space of the ceramic shaft 14. When power is supplied from the heater power supply, the heater electrode generates heat to heat the wafer placed on the first surface 12*a*. The heater electrode is not limited to the coil, and may be, for example, a ribbon (elongated thin plate) or a mesh.

The ceramic shaft 14 is a cylindrical shaft attached to the second surface 12*b* of the ceramic plate 12, and has a configuration similar to a configuration of a ceramic shaft adopted in a well-known ceramic susceptor. The ceramic shaft 14 includes the internal space for housing the rods (not illustrated) such as the ESC rod and the heater rods. The ceramic shaft 14 is preferably made of a ceramic material similar to the ceramic material of the ceramic plate 12. Therefore, the ceramic shaft 14 is preferably made of aluminum nitride. An upper end surface of the ceramic shaft 14 is preferably joined to the second surface 12*b* of the ceramic plate 12 by solid-phase joining or diffusion joining. An outer diameter of the ceramic shaft 14 is not particularly limited, and is, for example, about 40 mm. An inner diameter (diameter of internal space) of the ceramic shaft 14 is also not particularly limited, and is for example, about 36 mm.

The gas supply holes 16 are through holes penetrating through the ceramic plate 12 and the ceramic shaft 14 such that the gas supply holes 16 start from the first surface 12*a* of the ceramic plate 12, pass through the second surface 12*b*, and extend to the distal end 14*a* of the ceramic shaft 14 away from the ceramic plate 12. Providing the gas supply holes 16 makes it possible to supply gas to the first surface 12*a* of the ceramic plate 12. With the configuration, the wafer is placed on the first surface 12*a*. Therefore, supplying gas to the bottom surface of the wafer makes it possible to efficiently transfer the heat generated by the ceramic plate 12 (in particular, heater electrode) to the wafer. Thus, the gas supplied to the gas supply holes 16 is preferably inert gas excellent in heat transfer property, and especially preferably He gas.

A shape of each of the gas supply holes 16 in a planar view may be an optional shape such as a circular shape and a polygonal shape, but is preferably a circular shape. The number of gas supply holes 16 provided in the ceramic plate 12 is preferably 1 to 10, more preferably 2 to 6, and still more preferably 4. When the number of gas supply holes 16 is within the range, the gas can be sufficiently supplied while an effective area of the ceramic plate 12 is largely secured. A diameter of each of the gas supply holes 16 is not particularly limited, but is preferably 0.5 mm to 4.0 mm, more preferably 0.5 mm to 2.0 mm, and still more preferably 0.9 mm to 1.1 mm.

The porous plugs 18 are embedded in the portions of the gas supply holes 16 corresponding to at least the ceramic plate 12. The porous plugs 18 are not particularly limited as long as the porous plugs 18 are members or parts containing a porous material having ventilation property. Such a porous material is preferably made of an insulation material such as ceramic in order to efficiently suppress occurrence of arcing, and is made of, for example, alumina. The porous plug is generally known as a porous refractory that is mounted on a tuyere refractory on a bottom wall of a molten metal container such as a ladle and a tundish and has ventilation property for injecting gas into molten metal, and a commercially available porous plug is usable. In addition, a porous ceramic member that is referred to as a porous plug or a ceramic plug and is used for a gas introduction path of a susceptor for the electrostatic chuck and the like is also used as each of the porous plugs 18. A diameter of each of the porous plugs 18 is not particularly limited as long as the porous plugs 18 can close the gas supply holes 16. In other words, the porous plugs 18 each having the diameter matching with the diameter of each of the gas supply holes 16 may be selected, or the diameter of each of the gas supply holes 16 may be set so as to match with the diameter of each of the adopted porous plugs 18. The porous plugs 18 are preferably made of high-purity ceramic (for example, alumina) in terms of securement of a high withstand voltage. More specifically, purity of ceramic (for example, alumina) constituting the porous plugs 18 is preferably 70% or more, more preferably 80% or more, and still more preferably 85% or more. Purity of the porous plugs 18 is desirably high as much as possible. Therefore, the upper limit of purity is not particularly limited. A porosity of the porous plugs 18 is not particularly limited, but is preferably 30% to 70%, more preferably 35% to 65%, and still more preferably 40% to 60%. When the porosity is within the range, it is possible to achieve a desirable discharge suppression effect while ventilation property is sufficiently secured.

A length of each of the porous plugs 18 is also not particularly limited. The porous plugs 18 are embedded in the portions of the gas supply holes 16 corresponding to at least the ceramic plate 12 (namely, portions penetrating through ceramic plate 12). Therefore, the length of each of the porous plugs 18 is preferably greater than or equal to the thickness of the ceramic plate 12; however, the length of each of the porous plugs 18 is not limited thereto as long as occurrence of arcing can be suppressed. In any cases, the porous plugs 18 are present in the portions of the gas supply holes 16 corresponding to at least the ceramic plate 12, which advantageously improves insulation resistance between the wafer and the internal electrode 13 such as the ESC electrode and the RF electrode where a strong electric field is generated.

As described above, it is sufficient to dispose the porous plugs 18 at upper portions of the gas supply holes 16, and accordingly, portions with no porous plug 18 may be present in the gas supply holes 16. When the portions with no porous plug 18 are present, flow resistances caused by the porous plugs 18 are absent in the portions. This makes it possible to cause gas to smoothly flow through the gas supply holes 16. In this case, the susceptor 10 preferably further includes protective pipes 20 that are made of ceramic and form inner walls of the gas supply holes 16 in regions between lower ends of the porous plugs 18 and the distal end 14*a*. The gas supply holes 16 are protected by the respective protective pipes 20 in the above-described manner, which makes it possible to secure a flow path while preventing arcing. Further, upper ends of the protective pipes 20 can support the lower ends of the porous plugs 18. Therefore, the porous plugs 18 can be surely held at the upper portions of the gas supply holes 16. The protective pipes 20 are made of ceramic because of being excellent in heat resistance and insulation property, and are especially preferably made of alumina.

Figure 3:
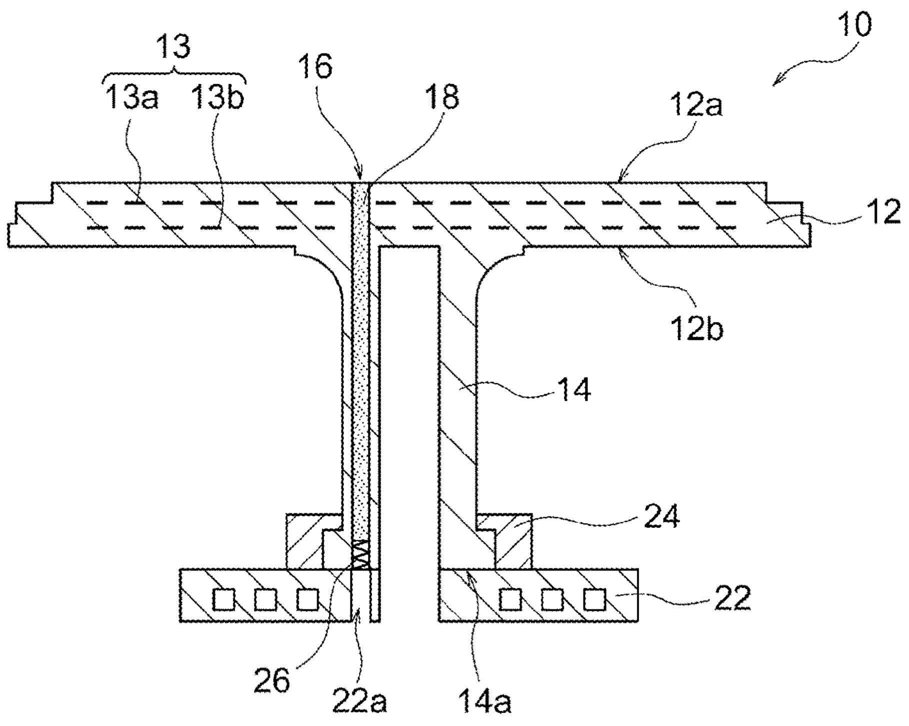
FIG. 3 is a schematic cross-sectional view illustrating another example of the susceptor according to the present invention.

As illustrated in FIG. 3, the porous plugs 18 may also be embedded in portions of the gas supply holes 16 corresponding to the ceramic shaft 14 (in addition to portions of gas supply holes 16 corresponding to ceramic plate 12). For example, the porous plugs 18 may be embedded over the entire lengths of the gas supply holes 16. In this case, occurrence of arcing can be more surely suppressed. In this aspect, flow resistances caused by the porous plugs 18 are present over most portions or the entire lengths of the gas supply holes 16; however, using the porous plugs 18 having high ventilation properties makes it possible to reduce influence by such a factor.

Figure 4:
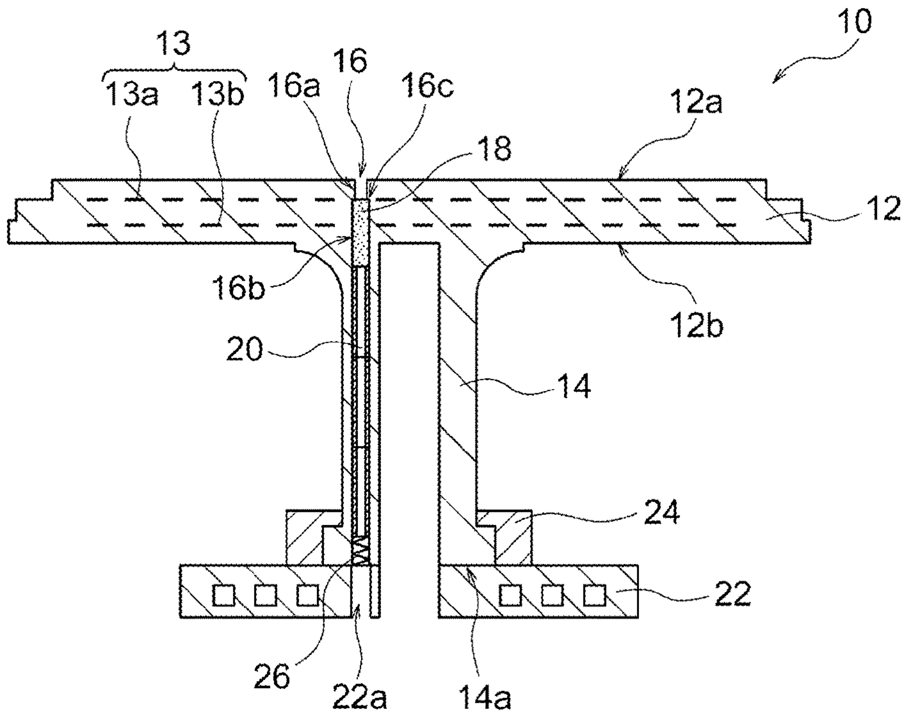
FIG. 4 is a schematic cross-sectional view illustrating still another example of the susceptor according to the present invention.

As illustrated in FIG. 4, each of the gas supply holes 16 may have a small-diameter portion 16*a* having a diameter less than the diameter of the corresponding porous plug 18 in the ceramic plate 12. In this case, the small-diameter portions 16*a* and respective corresponding lower portions 16*b* other than the small-diameter portions of the gas supply holes 16 form steps 16*c*, and the upper ends of the porous plugs 18 are preferably regulated by the respective corresponding steps 16*c* so as not to move above the steps 16*c*. With such a configuration, when the porous plugs 18 are pushed from the lower portion of the ceramic shaft 14 due to insertion of members such as the protective pipes 20 and elastic members 26, the porous plugs 18 are caught by the respective steps 16*c* and are prevented from deviating from predetermined positions. In other words, the porous plugs 18 can be stably held at the predetermined positions. The steps 16*c* are preferably provided at intermediate positions between the first surface 12*a* and the second surface 12*b* in the ceramic plate 12. The small-diameter portions 16*a* preferably extend from the respective corresponding steps 16*c* toward the first surface 12*a* or up to the first surface 12*a*. This makes it possible to secure sufficient strength for regulating the upper ends of the porous plugs 18.

A cooling jacket 22 is preferably fixed to the distal end 14*a* of the ceramic shaft 14. The cooling jacket 22 can effectively cool the ceramic shaft 14 (in particular, lower portion thereof). In this case, the cooling jacket 22 includes through holes 22*a* communicating with the respective gas supply holes 16. This makes it possible to supply gas to the gas supply holes 16 through the through holes 22*a*. The cooling jacket 22 is not particularly limited as long as the cooling jacket 22 is a metal member or part including a configuration that can cool the ceramic shaft 14. Since the cooling jacket 22 is made of a metal, if no porous plug 18 is provided, abnormal discharge may occur due to the insufficient insulation distance between the cooling jacket 22 and the first surface 12*a* of the ceramic plate 12 exposed to plasma. In the present invention, however, occurrence of arcing under the high-output plasma environment can be suppressed by embedding the porous plugs 18 at the above-described positions of the gas supply holes 16.

The susceptor 10 preferably further includes a clamp ring 24 that engages with the distal end 14*a* of the ceramic shaft 14 and fixes the ceramic shaft 14 to the cooling jacket 22. The clamp ring 24 can detachably and surely fix the ceramic shaft 14 to the cooling jacket 22.

The elastic members 26 having gas permeability may be provided at distal ends of the gas supply holes 16. When the elastic members 26 are provided, it is possible to alleviate influence of thermal expansion of the porous plugs 18 and/or the protective pipes 20, and to improve durability of the susceptor 10. When the porous plugs 18 and/or the protective pipes 20 are positionally deviated, a space may be generated and discharge may occur; however, the positional deviation of the porous plugs 18 and/or the protective pipes 20 is prevented by the elastic members 26, which makes it possible to reduce such a risk. Since the elastic members 26 are provided in the respective gas supply holes 16, the elastic members 26 are required to have gas permeability so as not to hinder the functions of the gas supply holes 16. In that sense, the elastic members 26 are preferably springs.

For example, in a case where the susceptor 10 includes the cooling jacket 22, the protective pipes 20, and the elastic members 26 as illustrated in FIG. 1, the elastic members 26 are preferably interposed between the cooling jacket 22 and the protective pipes 20. In this configuration, lengths of the elastic members 26 are regulated between the cooling jacket 22 and the protective pipes 20. Thus, thermal expansion of the porous plugs 18 and/or the protective pipes 20 can be absorbed by compression of the elastic members 26 within that section. As a result, it is possible to avoid loosening of fixation (in particular, fixation by clamp ring 24) of the ceramic shaft 14 and the cooling jacket 22.

In a case where the susceptor 10 further includes the cooling jacket 22 and the elastic members 26 and the porous plugs 18 are also embedded in the portions of the gas supply holes 16 corresponding to the ceramic shaft 14 (in addition to portions of gas supply holes 16 corresponding to ceramic plate 12) as illustrated in FIG. 3, the elastic members 26 are preferably interposed between the cooling jacket 22 and the porous plugs 18. In this configuration, the lengths of the elastic members 26 are regulated between the cooling jacket 22 and the porous plugs 18. Thus, thermal expansion of the porous plugs 18 can be absorbed by compression of the elastic members 26 within that section. As a result, it is possible to avoid loosening of fixation (in particular, fixation by clamp ring 24) of the ceramic shaft 14 and the cooling jacket 22.

What is claimed is:

1. A susceptor for a film deposition apparatus or for an etching apparatus, the susceptor comprising:

a ceramic plate including a first surface on which a wafer is to be placed, and a second surface opposed to the first surface, and embedded with an internal electrode;

a cylindrical ceramic shaft attached to the second surface of the ceramic plate;

a gas supply hole penetrating through the ceramic plate and the ceramic shaft, the gas supply hole starting from the first surface of the ceramic plate, passing through the second surface, and extending to a distal end of the ceramic shaft away from the ceramic plate;

a porous plug embedded in a portion of the gas supply hole corresponding to at least the ceramic plate; and a protective pipe made of ceramic and forming an inner wall of the gas supply hole in a region between a lower end of the porous plug and the distal end of the ceramic shaft; and wherein an upper end of the protective pipe supports a lower end of the porous plug.

2. The susceptor according to claim 1, further comprising a cooling jacket fixed to the distal end of the ceramic shaft, the cooling jacket including a through hole communicating with the gas supply hole.

3. The susceptor according to claim 2, further comprising: an elastic member having gas permeability and provided at the distal end in the gas supply hole; wherein the elastic member is interposed between the cooling jacket and the protective pipe.

4. The susceptor according to claim 2, further comprising an elastic member having gas permeability and provided at the distal end in the gas supply hole, wherein the porous plug is further embedded in a portion of the gas supply hole corresponding to the ceramic shaft, and the elastic member is interposed between the cooling jacket and the porous plug.

5. The susceptor according to claim 2, further comprising a clamp ring configured to engage with the distal end of the ceramic shaft, and to fix the ceramic shaft to the cooling jacket.

6. The susceptor according to claim 1, wherein the protective pipe is made of alumina.

7. The susceptor according to claim 1, wherein the gas supply hole includes, in the ceramic plate, a small-diameter portion having a diameter less than a diameter of the porous plug, the small-diameter portion and a lower portion other than the small-diameter portion of the gas supply hole form a step, and an upper end of the porous plug is regulated by the step not to move above the step.

8. The susceptor according to claim 1, further comprising an elastic member having gas permeability and provided at the distal end in the gas supply hole.

9. The susceptor according to claim 8, wherein the elastic member is a spring.

10. The susceptor according to claim 1, wherein the porous plug is further embedded in a portion of the gas supply hole corresponding to the ceramic shaft.

* * * * *